United States Patent [19]

Ashkin

[11] 4,014,011
[45] Mar. 22, 1977

[54] VARIABLE RESOLUTION DISPLAY
[75] Inventor: Peter B. Ashkin, Sunnyvale, Calif.
[73] Assignee: Hewlett-Packard Company, Palo Alto, Calif.
[22] Filed: Apr. 25, 1975
[21] Appl. No.: 571,874
[52] U.S. Cl. .................... 340/324 R; 235/92 EA; 324/122; 340/166 EL
[51] Int. Cl.² .......................................... G01D 7/00
[58] Field of Search ............... 340/324 R, 324 M; 324/122, 96

[56] References Cited

UNITED STATES PATENTS

| | | | |
|---|---|---|---|
| 3,754,121 | 8/1973 | Delay et al. | 340/324 R |
| 3,824,581 | 7/1974 | Ohno | 340/324 R |
| 3,825,827 | 7/1974 | Tumbush | 324/96 X |
| 3,833,933 | 9/1974 | Wilson | 340/324 R |
| 3,866,120 | 2/1975 | Ford | 324/96 X |
| 3,914,758 | 10/1975 | Ingle | 340/336 |

Primary Examiner—David L. Trafton
Attorney, Agent, or Firm—Theodore S. Park

[57] ABSTRACT

A display having variable resolution includes a plurality of discrete light emitting elements arranged in an array. Intervals between elements are quantized into a plurality of levels representing information to be displayed. Selected light emitting elements disposed about the levels are energized by a signal having a duty cycle varied in response to displayable information having a magnitude within a particular one of the plurality of levels.

12 Claims, 9 Drawing Figures

1    2    3..........I
I+1  I+2  I+3 ........2I
I(J-1)....................IJ
FIGURE 3B
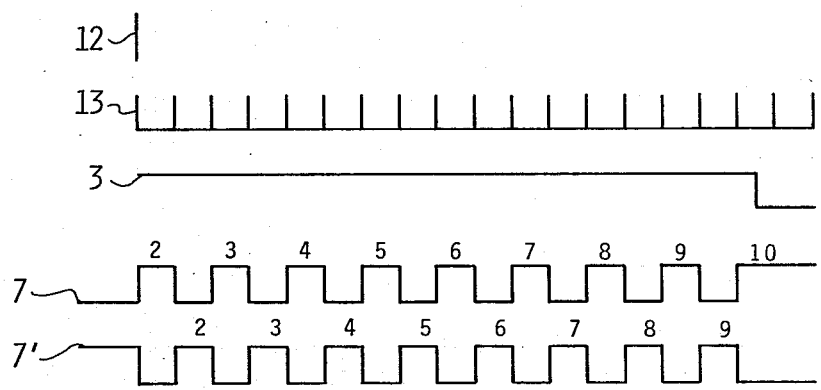
FIGURE 3C
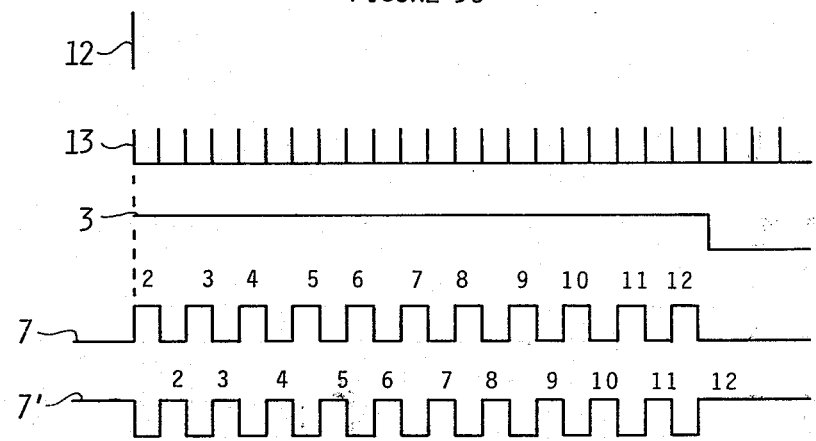
FIGURE 3D

VARIABLE RESOLUTION DISPLAY

BACKGROUND AND SUMMARY OF THE INVENTION

Visual displays in the form of arrays are useful in displaying quantized information in analog form. Typically an $n$ element array quantizes a full-scale value $V_f$ into $n$ discrete values. If a $j_{th}$ element is illuminated where $j$ is less than or equal to $n$, a reading of $j/n \cdot V_f$ is signified. The resolution of this form of display is ±50% divided by $n - 1$ of the full-scale value. To increase the resolution of prior devices, it is necessary to increase the number $n$ thereby requiring more elements. The invention is an improved display wherein resolution is increased without increasing the number of elements in the display.

DESCRIPTION OF THE DRAWINGS

FIG. 3B is a coincidence select scan matrix illustrating the preferred manner of coupling the counters to display elements of an array.

FIG. 3C is a timing diagram illustrating the output of the DIVIDE BY TWO COUNTER shown in FIG. 3A for differing initial states of the DIVIDE BY TWO COUNTER.

FIG. 3D illustrates the output of the DIVIDE BY TWO counter shown in FIG. 3A for differing initial states with reference to the output of pulse source 2, stop signal 3 and reset 12.

DESCRIPTION OF THE PREFERRED EMBODIMENT

Figure 1:
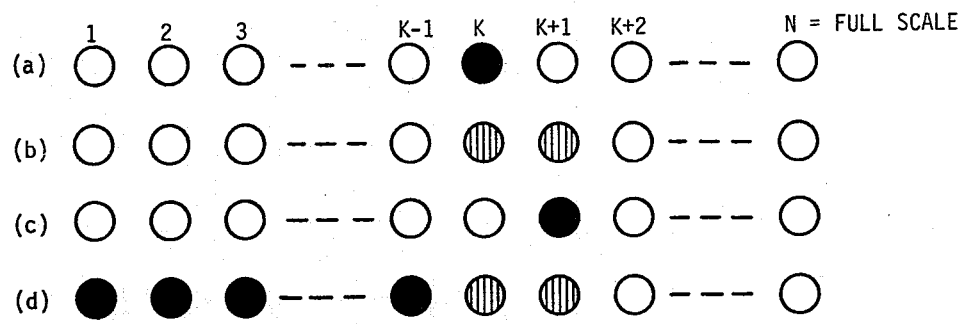
FIG. 1 is a histogram display made in accordance with the invention having a single level of quantization between elements of the array.

Referring to FIG. 1, there is shown a histogram display having a level of quantization halfway between elements $k$ and $k + 1$. Assuming $V_f$ is the full-scale value and referring to Figure array drawing (a) of FIG. 1, a reading of $k/n \cdot V_f$ is signified in the drawing by a shaded $k$ element. The shaded $k$ element in the figure represents a fully illuminated display element. For information corresponding to a quantization exactly halfway between elements $k$ and $k + 1$, each element $k$ and $k + 1$ is simultaneously illuminated with a 50% duty cycle as illustrated by cross hatched elements in Figure array drawing (b) of FIG. 1. The reading of FIG. 1b corresponds to a value equal to $V_f/n \cdot (k + \frac{1}{2})$. Referring to array drawing (c) of FIG. 1, there is shown a display corresponding to a value $V_f/n \cdot (k + 1)$. Array drawing (d) of FIG. 1 represents a bar graph version of a value corresponding to $V_f/n \cdot (k + \frac{1}{2})$. By allowing two elements to be illuminated in an apparent simultaneous manner to a viewer, an extra level of quantization exactly halfway between elements $k$ and $k + 1$ is provided. $2n$ discrete levels of quantization is thereby provided with $n$ display elements. This is a substantial improvement in read-out accuracy with no increase in $n$.

Figure 2:
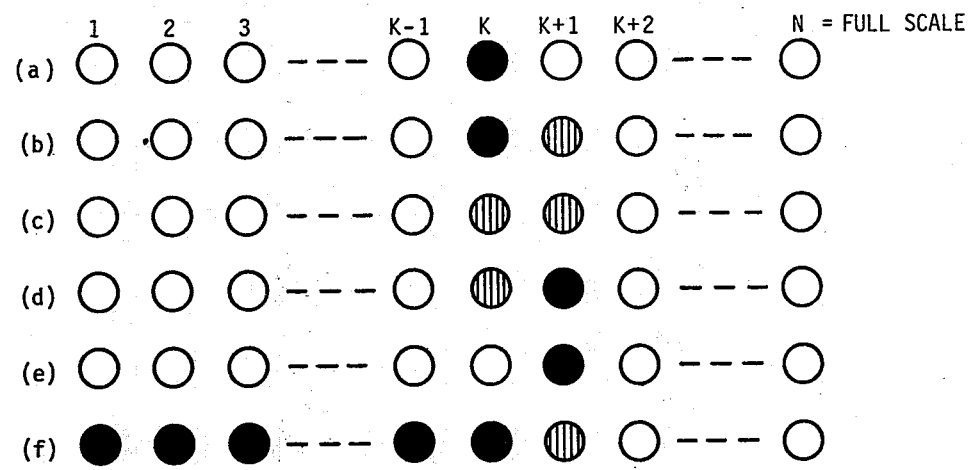
FIG. 2 is a display made in accordance with the invention having four levels of quantization between elements of the array.

Referring to FIG. 2, there is shown a display made in accordance with the invention having 4 levels of quantization between elements of the array. Array drawing (a) of FIG. 2 corresponds to a reading of $V_f/n \cdot k$. Array drawing (b) of FIG. 2 illustrates a $k$ element having a 75% duty cycle and a $k + 1$ element having a 25% duty cycle corresponding to an indicated value of $V_f/n \cdot (k + \frac{1}{4})$. Array drawing (c) of FIG. 2 illustrates a $k$ element and a $k + 1$ element each being illuminated with a 50% duty cycle and corresponding to a reading of $V_f/n \cdot (k + \frac{1}{2})$. Array drawing (d) of FIG. 2 illustrates a $k$ element having a 25% duty cycle and a $(k + 1)$ element having a 75% duty cycle corresponding to a reading of $V_f/n \cdot (k + \frac{3}{4})$. Array drawing (e) of FIG. 2 illustrates a $k + 1$ element having a 100% duty cycle corresponding to an indicated value of $V_f/n \cdot (k + 1)$. Array drawing (f) of FIG. 2 represents a bar graph version of array drawing (b) of FIG. 2 wherein elements 1 through $k$ are driven with a duty cycle of 100% and the $k + 1$ element is driven with a duty cycle of 50% corresponding to an indicated value of $V_f/n \cdot (k + \frac{1}{4})$. The accuracy and resolution of the display shown in FIG. 2 is increased to a value of ±50% ÷ 4($n$-1) of full-scale. An increase in resolution of four is achieved without increasing the number $n$ of elements in the display.

The number of quantizations between elements can be increased to a selected number P. The accuracy of a general $n$ element display with P quantized levels between elements has a read-out accuracy of ±50% divided by P · ($n$-1) of the full-scale value. Any desired accuracy is achieved with a proper choice of $n$ 2 and P. For practical purposes the preferred embodiment uses P = 4 or other small integer and varies $n$ to adjust to a desired full-scale accuracy.

Figure 3A:
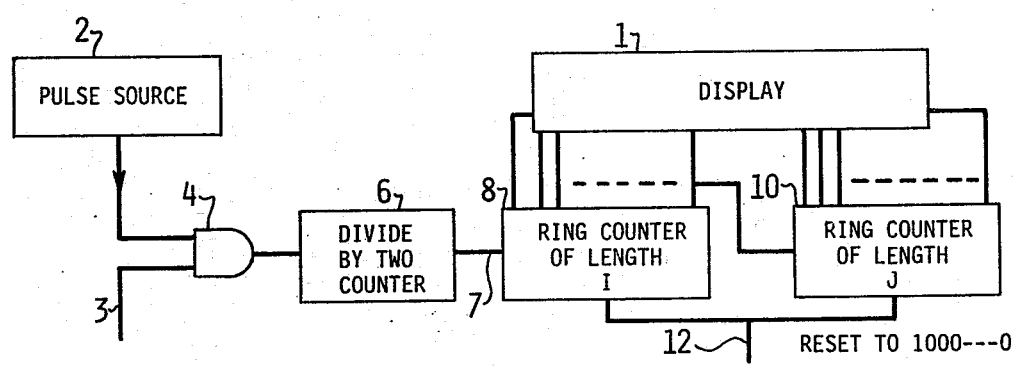
FIG. 3A is a block diagram of the preferred embodiment of a two-level quantizer made in accordance with the invention.

Referring to FIG. 3A, there is shown a two level quantizer for driving a display 1. An A-D converter or other pulse source 2 in combination with an AND-gate 4 responsive to a stop signal 3, for example, produces a number of pulses proportional to a desired value to be displayed. Gate 4 applies pulses to a divide by 2 counter 6. Divide by 2 counter 6 applies its output to a first ring counter 8 of length I.

A ring counter of length I is easily implemented with available digital logic in a manner shown, for example, by Richards in Digital Design, or the like. The first counter 8 drives elements of display 1 and drives a second ring counter 10 as shown in length J. A linear array of FIG. 1 is preferably driven in from a coincidence select matrix scan as shown, for example, in FIG. 3B wherein the elements of the linear array are designated, for example as 1, 2, 3, through $n$ where $n = i \cdot j$ and the coincidence select matrix is configured as shown in FIG. 3B. Upon the start of a measurement cycle, the first ring counter 8 of length I and the second ring counter 10 of length J are reset to their initial counting states by applying a reset signal 12 to counters 8 and 10. The function of these counters is to drive display 1 in the coincidence select matrix scan as depicted in FIG. 3b. Divide by 2 counter 6 is not reset.

Referring to FIG. 3a, the output 7 of counter 6 is in either of two states, low or high, as shown at points 7 and 7' respectively in FIG. 3c. The numbers shown in FIG. 3c refer to corresponding element positions within the matrix of FIG. 3b. If counter 6 is in an initial low state, a first clock pulse of clock signal 13 causes the output 7 of counter 6 to go high. A second clock pulse causes it to go low. If a stop signal 3 is applied to gate 4 after an odd number of clock pulses, regardless of the initial counting state of counter 6, the output 7 of counter 6 is in a complement of its initial state. An odd number of $k$ clock pulses, for example, results in a measurement cycle wherein the $(k+1)/2$ element is lit with a 50% duty cycle. On the next measurement cycle, element $[(k+1)/2 + 1]$ is lit with a 50% duty cycle. To a viewer the resulting display appears to have both elements illuminated with equal brightness.

Referring to FIG. 3D, a timing diagram is shown wherein stop signal 3 occurs after an even number of clock pulses is produced by source 2. The numbers shown refer to corresponding element positions within the matrix of FIG. 3b. Regardless of the initial counting state of counter 6, counter 6 stops in its original counting state after an even number of pulses. The $(k/2 + 1)$ element is illuminated on a 100% duty cycle if $k$ even pulses pass before the stop signal 3.

The 2 level quantizer operation of FIGS. 3A–3D may be summarized as follows. For the following number of pulses passed by gate 4 before application of stop signal 3:

if $K$ MOD $2 = 0$ only element $(k/2 + 1)$ with a 100% duty cycle is illuminated;

if $k$ MOD $2 = 1$ elements $[(k+1)/2 + 1]$; and $[(k+1)/2]$ are illuminated, each with a 50% duty cycle.

Figure 4:
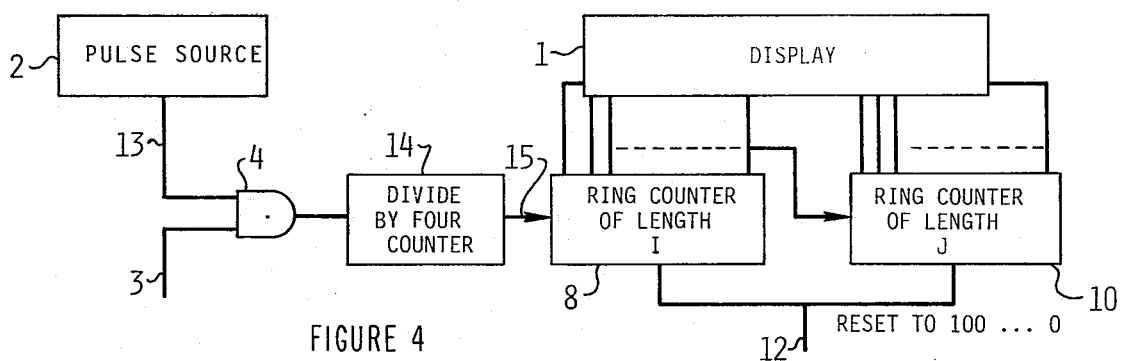
FIG. 4 is a block diagram of a four level quantizer for use with the display of FIG. 2.

Referring to FIG. 4, a four level quantizer is shown. The quantizer is similar in structure to that described above except that counter 6 has been replaced with a divide by 4 counter 14. Referring to FIG. 4 and timing sequences D through G of FIG. 5, it is seen that regardless of the initial counting state of divide by 4 counter 14, the quantizer interpolates to four levels between elements of a display as shown in FIG. 2. Thus, if $K$ clock pulses are passed before the stop signal:

for $k$ MOD $4 = 0$, only element $(k/4 + 1)$ is illuminated and with a 100% duty cycle;

for $k$ MOD $4 = 1$, elements $[(k+3)/4]$ and $[(k+3)/4 + 1]$ are illuminated and with 75% and 25% duty cycles respectively;

for $k$ MOD $4 = 2$, elements $[(k+2)/4]$ and $[(k+2)/4 + 1]$ are illuminated, each with a 50% duty cycle; and for $k$ MOD $4 = 3$, elements $[(k+1)/4]$ and $[(k+1)/4 + 1]$ are illuminated with 25% and 75% duty cycles respectively.

Figure 5:
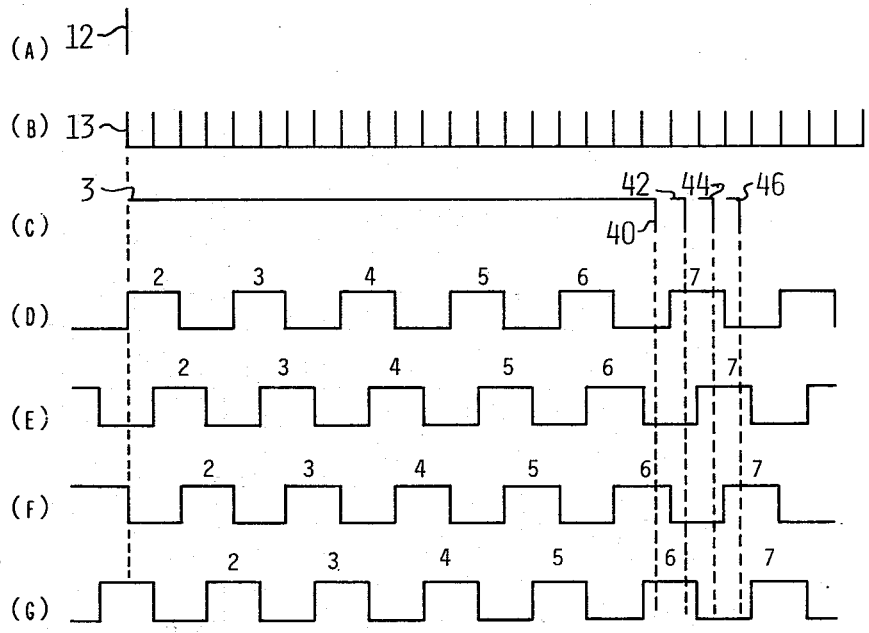
FIG. 5 illustrates the output 15 of the DIVIDE BY FOUR COUNTER 14 shown in FIG. 4 for differing initial states of COUNTER 14 with reference to reset signal 12, clock signal 13 and stop signal 3.

Referring to timing diagram C of FIG. 5 and a stop signal 3 occurring at times 40, 42, 44, and 46 is shown. Element 6 is illuminated for a stop signal 3 occurring at 40, elements 7, 6, 6, 6 for a stop signal 3 occurring at 42, elements 7 and 6 for a stop signal 3 occurring at 44, and elements 7, 7, 7, and 6 for a stop signal 3 occurring at 46 as illustrated in timing diagrams D through G of FIG. 5.

Figure 6:
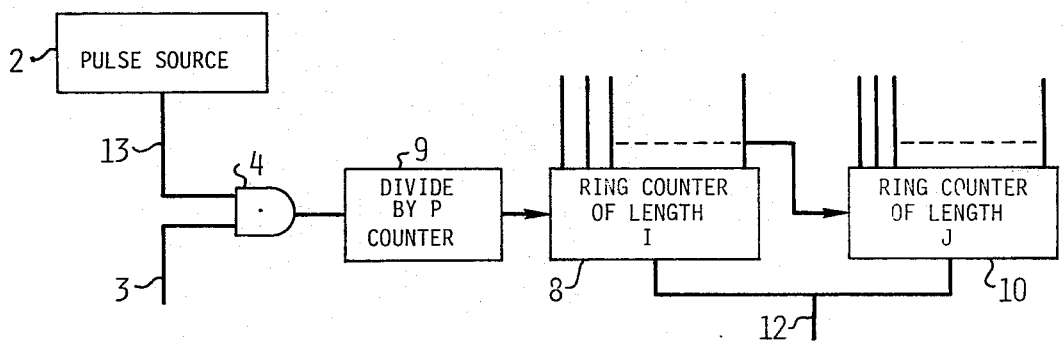
FIG. 6 is a block diagram of a quantizer producing a selected number of levels of quantization between elements.

Referring to FIG. 6, there is shown a generalized quantizer providing a selected number of interpolation levels between elements, wherein the selected number of levels is symmetric or even. The quantizer is similar in structure to the quantizers discussed above with the difference being that counters 6 and 7 of the previously described embodiments have been replaced with a counter 9 which is a divide by P counter, P being an even number. Thus, if $k$ clock pulses are passed before the stop signal:

for $k$ MOD $P = 0$, only element $[k/P + 1]$ is illuminated and with a 100% duty cycle;

for $k$ MOD $P = 1$, elements $[(k + P - 1)/P]$ and $[(k + P - 1)/P + 1]$ are illuminated with $100(P-1)\%/P$ and $100\%/P$ duty cycles respectively;

for $k$ MOD $P = 2$, elements $[(k + P - 2)/P]$ and $[(k + P - 2)/P + 1]$ are illuminated with $100(P-2)\%/P$ and $(2)100\%/P$ duty cycles respectively;

for $k$ MOD $P = P/2$, elements $[(k + P - P/2)/P]$ and $[(k + P - P/2)P + 1]$ are illuminated, each at 50% duty cycle; and for $k$ MOD $P = P-1$, elements $[(k + P - (P - 1)/P]$ and $[(k + P - (P - 1))/P + 1]$ are illuminated with $100[P-(P-1)]\%/P$ and $(P-1)100\%/P$ duty cycles respectively.

Other preferred embodiments include a display wherein display elements vary their light absorption or light transmissibility or other optical characteristics in response to driving signals having varying duty cycles as described hereinabove. Acoustically tuned optical light filters positioned to receive light and disposed in an array and driven by acoustic generators coupled to counters 8 and 10, for example, is another preferred embodiment made in accordance with the invention.

I claim:

1. A display comprising:

an array having $n$ display elements positioned to represent values by their position and light emission, each display element emitting light in response to a driving signal; and quantizing means coupled to receive an applied signal corresponding to a value to be displayed and coupled to a plurality of the $n$ display elements for applying driving signals having variable duty cycles to the plurality of display elements, the duty cycle of each driving signal being responsive to and determined by the value to be displayed.

2. A display as in claim 1 wherein quantizing means comprise:

a pulse source coupled to receive the applied signal for producing a number of pulses proportional to the value to be displayed;

a dividing counter coupled to the pulse source for producing 1/P of the pulses applied thereto as an output, P being an integer;

means for coupling the display elements in a coincidence select matrix scan configuration having I lines coupled to the elements and J lines coupled to the elements wherein each of said $n$ elements has one of said I lines and one of said J lines coupled thereto;

first counting means coupled to receive the dividing counter output and connected to the I lines for driving the elements; and second counting means coupled to the first counting means and to the J lines for driving the elements.

3. A display as in claim 1 wherein the $n$ display elements are disposed in a linear array and the linear interval between elements of the array are quantized into a plurality of levels representing information to be displayed and the quantizing means produces driving signals having duty cycles determined by a value to be displayed corresponding to one of said plurality of levels.

4. A display as in claim 2 comprising means coupled to the dividing counter for resetting the dividing counter.

5. A display as in claim 4 wherein means for resetting comprise a logic gate having a first input coupled to receive pulses from the pulse source a second input coupled to receive an applied reset signal and an output coupled to apply pulses to the dividing counter.

6. A display comprising:
an array having $n$ display elements positioned to represent values by their position and optical characteristics, each display element varying an optical characteristic in response to a driving signal; and
quantizing means coupled to receive an applied signal corresponding to a value to be displayed and coupled to a plurality of the $n$ display elements for applying driving signals having variable duty cycles to the plurality of display elements, the duty cycle of each driving signal being responsive to and determined by the value to be displayed.

7. A display as in claim 6 wherein quantizing means comprise:
a pulse source for producing a number of pulses proportional to the value to be displayed;
a dividing counter coupled to the pulse source for producing 1/P of the pulses applied thereto as an output, P being an integer;
means for coupling the display elements in a coincidence select matrix scan configuration having I lines coupled to the elements and J lines coupled to the elements wherein each of said display elements has one of said I lines and one of J lines coupled thereto;
first counting means coupled to receive the dividing counter output and connected to the I lines for driving the elements; and
second counting means coupled to the first counting means and to the J lines for driving the elements.

8. A display as in claim 6 wherein the $n$ display elements are disposed in a linear array and the linear interval between elements of the array are quantized into a plurality of levels representing information to be displayed and the quantizing means produces driving signals having duty cycles determined by a value to be displayed corresponding to one of said plurality of levels.

9. A display as in claim 7 comprising means coupled to the dividing counter for resetting the dividing counter.

10. A display as in claim 9 wherein means for resetting comprise a logic gate having a first input coupled to receive pulses from the pulse source a second input coupled to receive an applied reset signal and an output coupled to apply pulses to the dividing counter.

11. A display as in claim 2 wherein the first and second counting means comprise ring counters of lengths I and J, respectively.

12. A display as in claim 7 wherein the first and second counting means comprise ring counters of lengths I and J, respectively.

* * * * *

UNITED STATES PATENT AND TRADEMARK OFFICE
CERTIFICATE OF CORRECTION

PATENT NO. : 4,014,011
DATED : March 22, 1977
INVENTOR(S) : Peter B. Ashkin

It is certified that error appears in the above-identified patent and that said Letters Patent are hereby corrected as shown below:

Column 1, line 55, cancel "Figure";

Column 2, line 38, between "n" and "2" insert -- $\geq$ --;

Column 2, line 68, cancel "FIG. 3a" and substitute -- FIG. 3c --.

Signed and Sealed this sixteenth Day of August 1977

[SEAL]

Attest:

RUTH C. MASON
*Attesting Officer*

C. MARSHALL DANN
*Commissioner of Patents and Trademarks*